(12) United States Patent
Kang et al.

(10) Patent No.: US 11,409,387 B2
(45) Date of Patent: Aug. 9, 2022

(54) DISPLAY DEVICE, APPARATUS FOR MANUFACTURING DISPLAY DEVICE AND METHOD FOR MANUFACTURING DISPLAY DEVICE

(71) Applicant: Samsung Display Co., LTD., Yongin-si (KR)

(72) Inventors: Eui Jeong Kang, Suwon-si (KR); Sang Hyuck Yoon, Seoul (KR); Seung Soo Ryu, Hwaseong-si (KR); Jeong Jin Park, Hwaseong-si (KR); Si Joon Song, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/403,208

(22) Filed: Aug. 16, 2021

(65) Prior Publication Data
US 2022/0107697 A1   Apr. 7, 2022

(30) Foreign Application Priority Data

Oct. 6, 2020   (KR) .................. 10-2020-0128821

(51) Int. Cl.
*G06F 3/041* (2006.01)
*G06F 3/044* (2006.01)
*H01L 27/32* (2006.01)

(52) U.S. Cl.
CPC .......... *G06F 3/0412* (2013.01); *G06F 3/0446* (2019.05); *H01L 27/323* (2013.01); *G06F 2203/04103* (2013.01)

(58) Field of Classification Search
CPC ..................................................... G06F 3/0412
See application file for complete search history.

(56) References Cited

U.S. PATENT DOCUMENTS

2018/0358413 A1*  12/2018  Lee ..................... H01L 27/323

FOREIGN PATENT DOCUMENTS

| CN | 106847864 | 6/2017 |
|---|---|---|
| KR | 10-2006-0042464 | 5/2006 |

* cited by examiner

*Primary Examiner* — Robin J Mishler
(74) *Attorney, Agent, or Firm* — Kile Park Reed & Houtteman PLLC

(57) ABSTRACT

A display device includes a display panel including display pads, display connection pads disposed on a side surface of the display panel and connected to the display pads, a touch member including touch pads disposed on a display surface perpendicular to the side surface of the display panel, and touch connection pads overlapping a top surface of the touch member and the side surface of the display panel and connected to the touch pads. The side surface of the display panel includes a first area overlapping the display connection pads, a second area overlapping the touch connection pads, and a third area which does not overlap the display connection pads and does not overlap the touch connection pads. The first area, the second area, and the third area are located on a same plane.

9 Claims, 21 Drawing Sheets

CDF: CDF_R, CDF1, CDF2, CDF3

DISPLAY DEVICE, APPARATUS FOR MANUFACTURING DISPLAY DEVICE AND METHOD FOR MANUFACTURING DISPLAY DEVICE

CROSS-REFERENCE TO RELATED APPLICATION

This application claims priority to and benefits of Korean Patent Application No. 10-2020-0128821 under 35 U.S.C. § 119, filed on Oct. 6, 2020 in the Korean Intellectual Property Office, the entire contents of which are incorporated herein by reference.

BACKGROUND

1. Technical Field

The disclosure relates to a display device, an apparatus for manufacturing the display device and a method for manufacturing the display device.

2. Description of the Related Art

The importance of display devices has steadily increased with the development of multimedia technology. Various types of display devices such as organic light emitting displays (OLEDs), liquid crystal displays (LCDs) and the like have been developed. Such display devices have been applied to various mobile electronic devices, for example, portable electronic devices such as smart phones, smart watches, and tablet PCs.

The display device includes a substrate partitioned into a display area and a non-display area. Pixels are disposed on the substrate in the display area, and pads and the like are disposed on the substrate in the non-display area. A flexible film, such as chip on film (COF), having a driving circuit and the like is coupled to the pads to transmit driving signals to the pixels. To reduce the non-display area of the display device, the flexible film may be attached to the side surface of the substrate.

The flexible film may include leads coupled to the pads, and the leads may be bonded to the pads separated from each other. The bonding may be performed using an anisotropic conductive film, or may be performed by an ultrasonic bonding process in which the pads and the leads are in direct surface contact with each other.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device having a side surface to which a circuit board is attached and capable of minimizing occurrence of a short circuit between electrode pads.

Aspects of the disclosure also provide a display device manufacturing method capable of manufacturing the display device by a simple process.

Aspects of the disclosure also provide a display device manufacturing apparatus for implementing the display device manufacturing method.

However, aspects of the disclosure are not restricted to those set forth herein. The above and other aspects of the disclosure will become more apparent to one of ordinary skill in the art to which the disclosure pertains by referencing the detailed description of the disclosure given below.

An embodiment of a display device may include a display panel including display pads, display connection pads disposed on a side surface of the display panel and connected to the display pads, a touch member including touch pads disposed on a display surface perpendicular to the side surface of the display panel, and touch connection pads overlapping a top surface of the touch member and the side surface of the display panel and connected to the touch pads. The side surface of the display panel may include a first area overlapping the display connection pads, a second area overlapping the touch connection pads, and a third area which does not overlap the display connection pads and does not overlap the touch connection pads. The first area, the second area, and the third area may be located on the same plane.

In an embodiment, the side surface of the display panel may have a uniform roughness in the first area, the second area, and the third area.

In an embodiment, the side surface may include a display pad area where the display pads and the display connection pads may be arranged, a touch pad area where the touch pads and touch connection pads may be arranged. The touch pad area and the display pad area may be disposed in a first direction.

In an embodiment, the display pads and the touch pads may be arranged in the first direction.

In an embodiment, the display device may further include a first circuit board disposed on the display connection pads, and a second circuit board disposed on the touch connection pads. A display driving circuit may be disposed on the first circuit board. A touch driving circuit may be disposed on the second circuit board.

The second circuit board may partially overlap the top surface of the touch member.

In an embodiment, the display panel may include a first substrate, a second substrate disposed on the first substrate, and a sealant disposed between the first substrate and the second substrate.

In an embodiment, each of the display connection pads, and the touch connection pads may have a shape protruding toward the sealant.

In an embodiment, the second substrate may include a chamfer portion that may be disposed at an end overlapping the display pad.

An embodiment of an apparatus for manufacturing a display device may include a first stage; a first laser module that emits a first laser beam toward the first stage; a second stage disposed on a side of the first stage; a pressing tool disposed above the second stage; and a second laser module that emits a second laser beam toward the second stage. The pressing tool may be disposed between the second laser module and the second stage. The first laser beam may be a short pulse laser beam. The second laser beam may be a continuous wave (CW) laser beam.

In an embodiment, the pressing tool may include a silicon member disposed at a lower portion of the pressing tool.

In an embodiment, the pressing tool may include a transparent material.

In an embodiment, the bottom surface of pressing tool may include a chamfer portion.

In an embodiment, each of the first stage and the second stage may have an adjustable inclination angle.

In an embodiment, the apparatus may further include a conductive film including a conductive material that is patterned on the first stage and transferred onto the side surface of the display device on the second stage.

An embodiment of a method for manufacturing a display device may include patterning a conductive material on a conductive film to form first patterns and second patterns that are larger than the first patterns, transferring the first patterns onto a side surface of the display device to form a first pad, transferring the second patterns onto the side surface of the display device to form a second pad, attaching a first circuit board on the first pad, and attaching a second circuit board on the second pad.

In an embodiment, the patterning of the conductive material may include applying a short pulse laser beam.

In an embodiment, the forming of first pad and the forming of the second pad may include applying a continuous wave laser beam.

In an embodiment, the forming of the first pad and the forming of the second pad may comprise disposing the conductive film including the first patterns and the second patterns on the side surface of the display device, and disposing a pressing tool on the conductive film to irradiate the continuous wave laser beam.

In an embodiment, the attaching of the first circuit board and the attaching of the second circuit board may comprise disposing the first circuit board on the first pad, disposing the second circuit board on the second pad, and disposing the pressing tool on the first circuit board and the second circuit board to irradiate the continuous wave laser beam.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

Hereinafter, embodiments will be described in detail with reference to the accompanying drawings.

Figure 1:
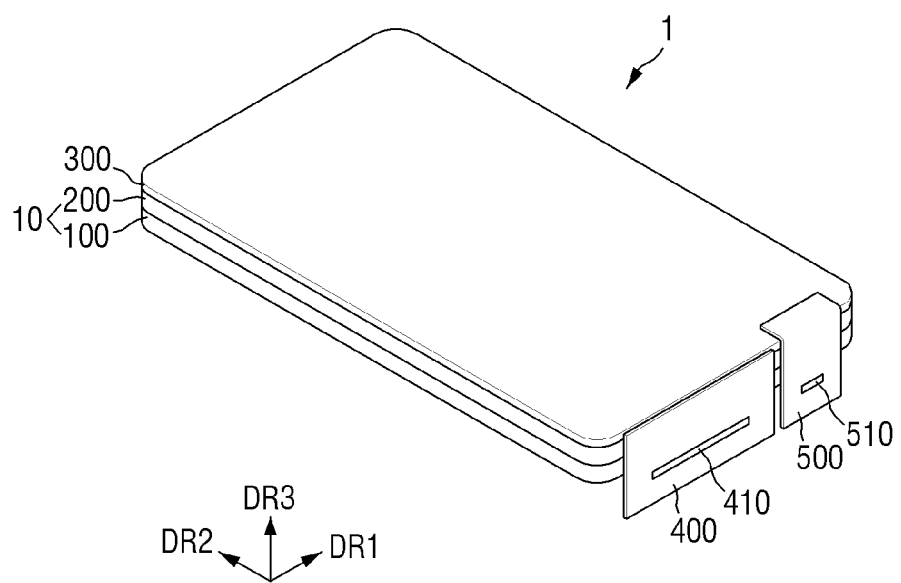
FIG. 1 is a schematic perspective view of a display device according to an embodiment.
Figure 2:
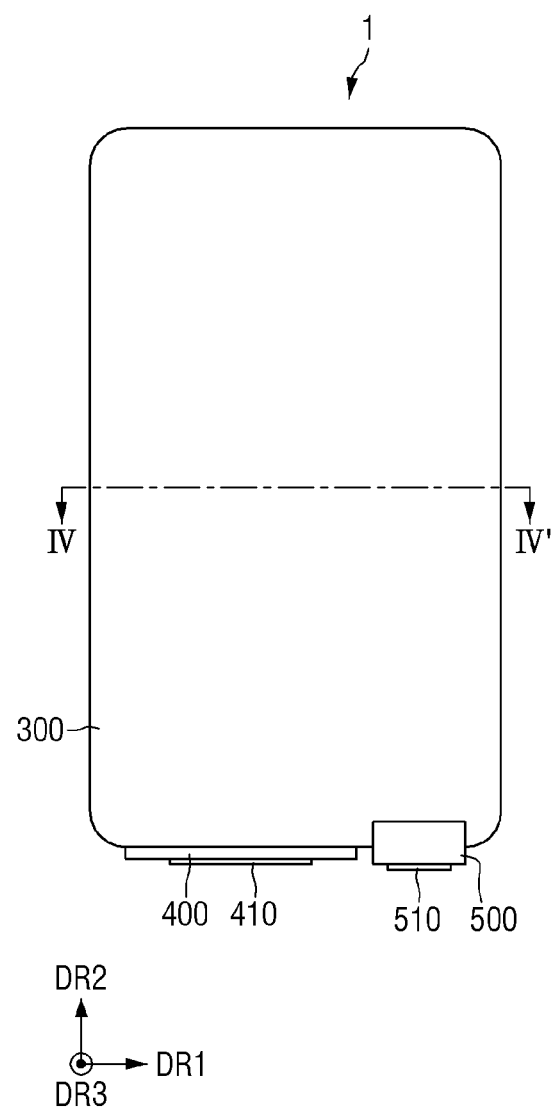
FIG. 2 is a schematic plan view of a display device according to an embodiment.
Figure 3:
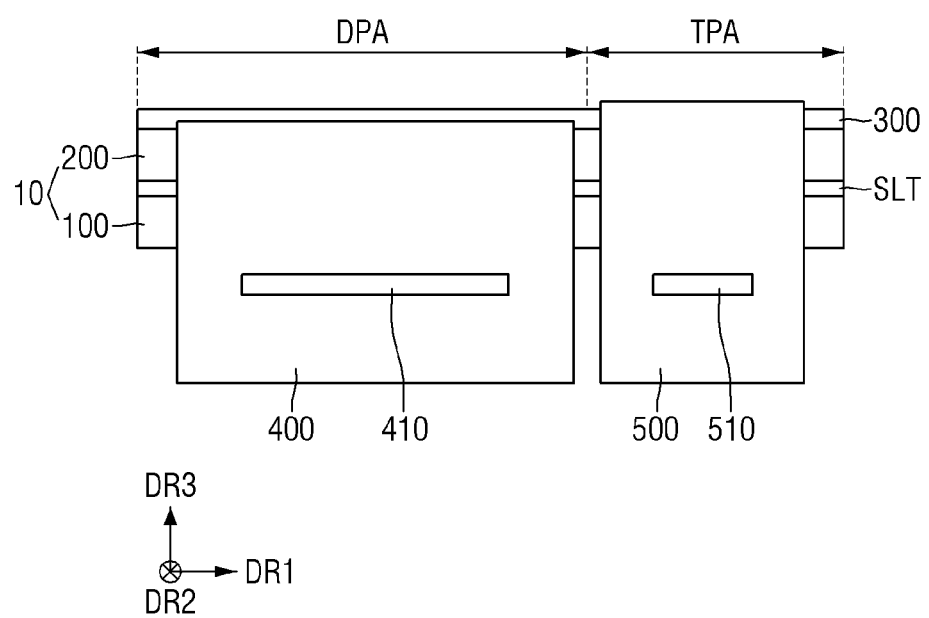
FIG. 3 is a schematic side view of a display device according to an embodiment.
Figure 4:
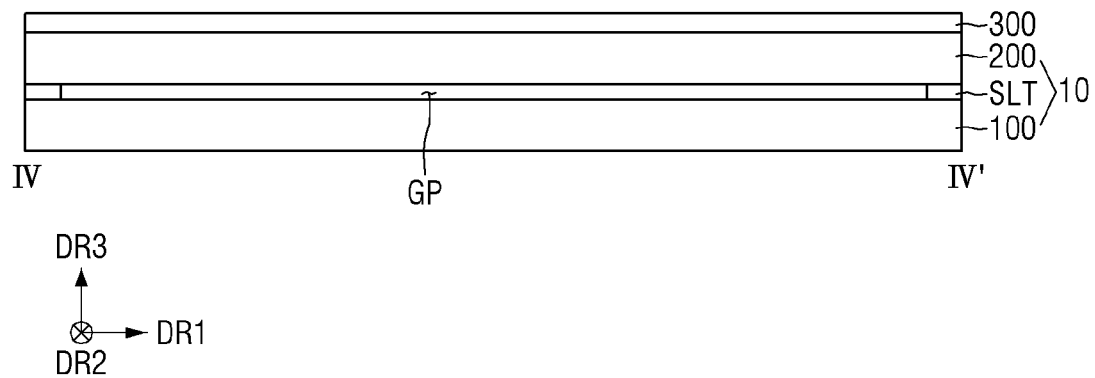
FIG. 4 is a schematic cross-sectional view taken along line IV-IV' of FIG. 2.

FIG. 1 is a perspective view of a display device according to an embodiment. FIG. 2 is a plan view of a display device according to an embodiment. FIG. 3 is a side view of a display device according to an embodiment. FIG. 4 is a cross-sectional view taken along line IV-IV' of FIG. 2.

Referring to FIGS. 1 to 4, the display device 1 is a device for displaying a moving image or a still image. The display device 1 may be used as a display screen of various devices, such as a television, a laptop computer, a monitor, a billboard, and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC). The display device 1 may be an organic light emitting display device, a liquid crystal display device, a plasma display device, a field emission display device, an electrophoretic display device, an electrowetting display device, a quantum dot light emitting display device, a micro LED display device, or the like. In the following, an organic light emitting display device will be described as an example of the display device 1, but the display device 1 is not limited thereto.

Figure 5:
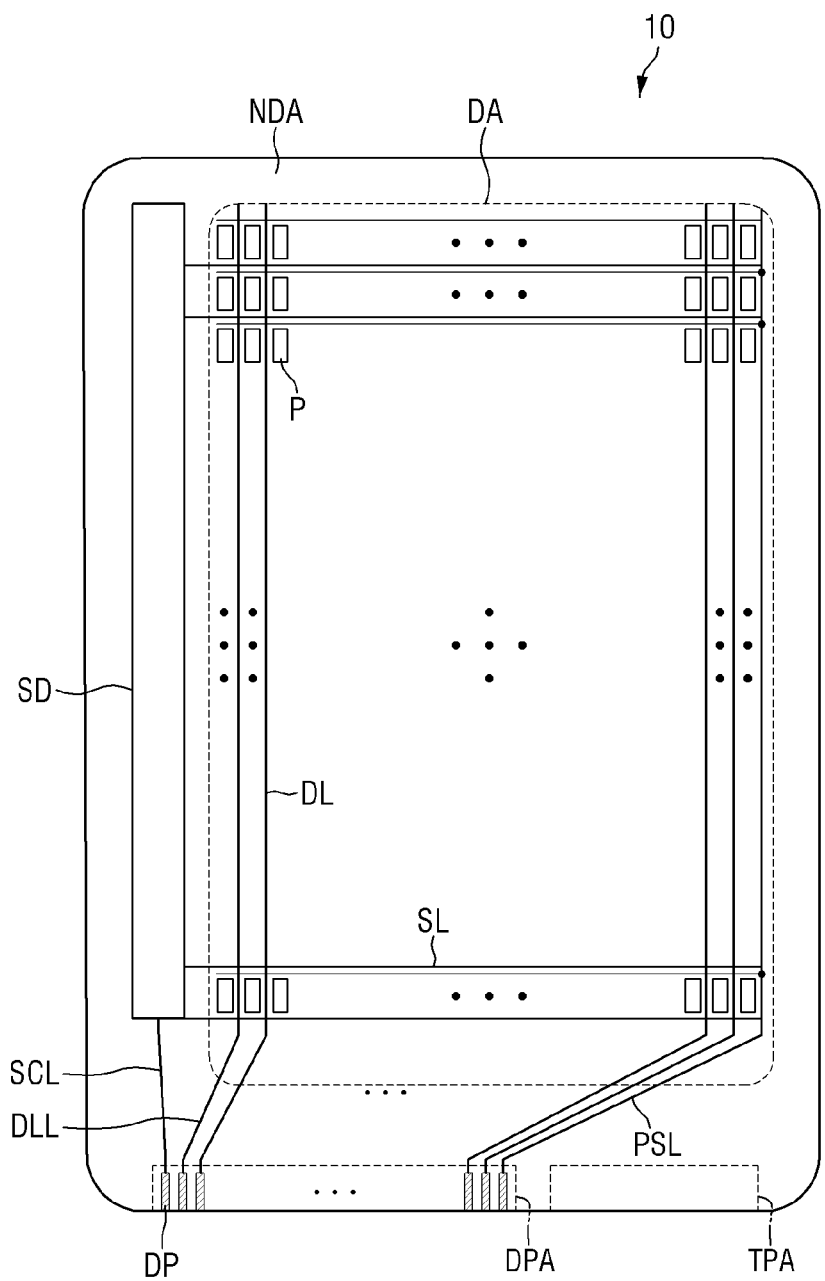
FIG. 5 is a schematic plan view of a display panel according to an embodiment.

The display device 1 may include a display area DA displaying an image and a non-display area NDA disposed around the display area DA with reference to FIG. 5. The display area DA may have a rectangular shape with right-angled or rounded corners in a plan view. The planar shape of the display area DA is not limited to a rectangular shape, but may have a circular shape, an elliptical shape, or various other shapes. The non-display area NDA may be disposed adjacent to both short sides of the display area DA. Furthermore, the non-display area NDA may be disposed adjacent to both long sides as well as both short sides of the display area DA. The non-display area NDA may be disposed to surround all sides of the display area DA and form edges of the display area DA.

In an embodiment, the display device 1 may be formed in a rectangular shape having short sides extending in a first direction DR1 and long sides extending in a second direction DR2 in a plan view. The corner where the short side extending in the first direction DR1 and the long side extending in the second direction DR2 meet may be rounded. However, the disclosure is not limited thereto, and the corner may be right-angled. In other examples, the shape of the display device 1 in a plan view is not limited to a rectangular shape, and may have other shapes such as a polygonal shape, a circular shape, or elliptical shape.

The top surface of the display device 1 may be flat. However, the disclosure is not limited thereto, and the top surface of the display device 1 may include curved portions formed at both ends in the first direction DR1 or at both ends in the second direction DR2. The curved portions may have a constant curvature or a changing curvature. Furthermore, the display device 1 may be curved, bent, folded, or rolled.

Referring to FIG. 1, The display device 1 includes a display panel 10. The display panel 10 may include a first substrate 100 and a second substrate 200 disposed on the first substrate 100. A sealant SLT formed along edges may be disposed between the first substrate 100 and the second substrate 200. The sealant SLT may bond the first substrate 100 and the second substrate 200 to each other.

The display device 1 may further include a touch member 300. The touch member 300 may be disposed on the display panel 10. In an embodiment, the touch member 300 may be formed on the second substrate 200. In another example, the touch member 300 may be provided in the form of a separate panel and attached onto the display panel 10.

Although not shown, the display device 1 may further include a polarizing member (not shown), a cover window (not shown) disposed on the touch member 300, and an adhesive layer (not shown) disposed between the polarizing member and the cover window. The polarizing member (not shown) may block light reflected from the surface of the display device 1 to improve visibility, and the cover window (not shown) may protect the display device 1. The adhesive layer (not shown) may attach the polarizing member (not shown) and the cover window (not shown).

Referring to FIG. 2, a first circuit board 400 and a second circuit board 500 may be disposed on at least one side surface (the other side surface in the second direction DR2 in FIG. 2) of the display device 1. The first circuit board 400 may be a display driving circuit board, and the second circuit board 500 may be a touch driving circuit board. The first circuit board 400 and the second circuit board 500 may be side-bonded to at least a side surface of the display device 1.

The side surface of the display device 1 may include a display pad area DPA where display connection pads DCP (refer to FIG. 10) are disposed and a touch pad area TPA where touch connection pads TCP (refer to FIG. 10) are disposed. The display pad area DPA and the touch pad area TPA may be disposed in parallel in a longitudinal direction (the first direction DR1 in the drawing) of a side surface. The first circuit board 400 may be bonded to the display pad area DPA, and the second circuit board 500 may be bonded to the touch pad area TPA.

Referring to FIG. 3, driving circuits may be disposed on the circuit boards 400 and 500. For example, a display driving circuit 410 may be mounted on the first circuit board 400, and a touch driving circuit 510 may be mounted on the second circuit board 500. However, the disclosure is not limited thereto, and the display driving circuit 410 or the touch driving circuit 510 may be omitted or may be disposed outside the circuit boards 400 and 500.

The display driving circuit 410 may output signals and voltages for driving the display panel 10. For example, the display driving circuit 410 may supply data voltages to data lines DL (refer to FIG. 5). Furthermore, the display driving circuit 410 may supply source voltages to a power supply line PSL (refer to FIG. 5) and scan control signals to a scan driver. The display driving circuit 410 may be formed as an integrated circuit (IC) and mounted on the first circuit board 400.

The touch driving circuit 510 may be electrically connected to the touch electrode of the touch member 300. The touch driving circuit 510 applies touch driving signals to the touch electrode of the touch member 300 and measures the capacitance values of the touch electrode. The touch driving signal may be a signal having driving pulses. The touch driving circuit 510 may determine whether a touch is inputted based on the capacitance values, and may calculate the touch coordinates at which touch is inputted. The touch driving circuit 510 may be formed as an integrated circuit (IC) and mounted on the second circuit board 500.

The circuit boards 400 and 500 may be bonded to the display device 1 using an anisotropic conductive film. For example, the first circuit board 400 may be attached onto display connection pads DCP of the display panel 10. Accordingly, the lead lines (not shown) of the first circuit board 400 may be electrically connected to the display connection pads DCP of the display panel 10. The second circuit board 500 may be attached onto touch connection pads TCP of the touch member 300. The second circuit board 500 may be disposed to cover the other side surface of the display device 1 in the second direction DR2 and a part of one side surface of the display device 1 in a third direction DR3. The second circuit board 500 may partially overlap the top surface of the touch member 300 in a third direction DR3. Accordingly, the lead lines (not shown) of the second circuit board 500 may be electrically connected to the touch connection pads TCP of the touch member 300.

The circuit boards 400 and 500 may be a flexible printed circuit board, a printed circuit board, or a flexible film such as a chip on film.

Hereinafter, the display panel 10 and the touch member 300 will be described in detail with reference to FIGS. 5 to 8.

Figure 6:
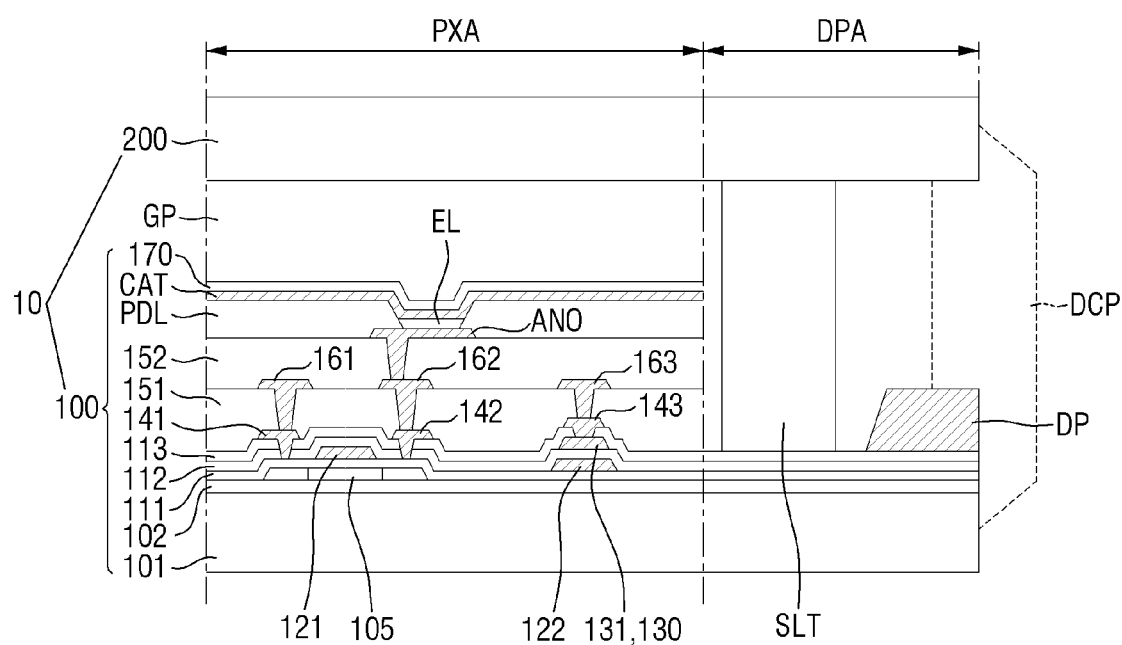
FIG. 6 is a schematic partial cross-sectional view of the display panel of FIG. 5.
Figure 6:
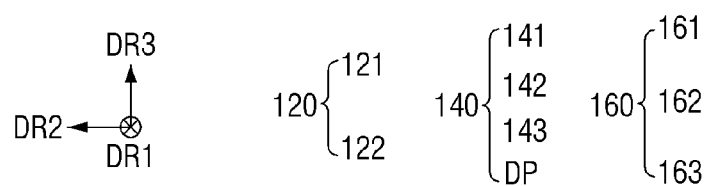

FIG. 5 is a schematic plan view of a display panel according to an embodiment. FIG. 6 is a schematic partial cross-sectional view of the display panel of FIG. 5. FIG. 6 shows a part of the display area DA and a part of the display pad area DPA of the display panel 10.

Referring to FIGS. 5 and 6, the display panel 10 may include a display area DA in which pixels are formed to display an image, and a non-display area NDA which is a peripheral area of the display area DA. The non-display area NDA may include the display pad area DPA where display pads DP are disposed. The display pad area DPA may be disposed at the lower end (the other end in the second direction DR2 in the drawing) of the display panel 10 in a plan view. In a plan view, the display pad area DPA and the touch pad area TPA to be described later may be disposed in parallel in the first direction DR1.

In the display pad area DPA, the display pads DP may be disposed along the first direction DR1. The other side surface of the display pad DP in the second direction DR2 may electrically contact the display connection pad DCP. The arrangement structure of the display pad DP and the display connection pad DCP will be described in detail later.

Scan lines SL, data lines DL, a power supply line PSL, and pixels P may be disposed in the display area DA. The scan lines SL may be formed in parallel in the first direction DR1, and the data lines DL may be formed in parallel in a second direction DR2 which intersects the first direction DR1. The power supply line PSL may include at least one line formed in parallel with the data lines DL in the second direction DR2 and lines branched from the at least one line in the first direction DR1.

Each of the pixels P may be electrically connected to at least one of the scan lines SL, one of the data lines DL, and the power supply line PSL. Each of the pixels P may include thin film transistors including a driving transistor and at least one switching transistor, an organic light emitting diode, and a capacitor. In case that a scan signal is applied from the scan line SL, each of the pixels P may receive the data voltage of the data line DL and supply a driving current to an organic light emitting diode in response to the data voltage applied to the gate electrode 121 to emit light.

A scan driver SD, a scan control line SCL, and data link lines DLL may be disposed in the non-display area NDA. The data link line DLL may electrically connect the data line DL to the display pad DP.

The scan driver SD may be electrically connected to the display pad DP through at least one scan control line SCL. Therefore, the scan driver SD may receive the scan control signal. The scan driver SD generates scan signals according to the scan control signal and supplies the scan signals to the scan lines SL.

Although FIG. 5 illustrates that the scan driver SD is formed in the non-display area NDA located at one outer side of the display area DA, the disclosure is not limited thereto. For example, the scan driver SD may be formed in the non-display area NDA located at both outer sides of the display area DA.

Referring to FIG. 6, the display panel 10 may include a base substrate 101, conductive layers disposed on the base substrate 101, insulating layers for insulating the conductive layers, an organic light emitting layer EL, and the like.

The base substrate 101 may be disposed over the entire display area DA and the entire non-display area NDA. The base substrate 101 may function to support various elements disposed thereon. In an embodiment, the base substrate 101 may be a rigid substrate including a rigid material such as soft glass, quartz, or the like. However, the disclosure is not limited thereto, and the base substrate 101 may be a flexible substrate including a flexible material such as polyimide (PI).

The buffer layer 102 may be disposed on the base substrate 101. The buffer layer 102 can prevent penetration of moisture and oxygen from the outside through the base substrate 101.

A semiconductor layer 105 may be disposed on the buffer layer 102. The semiconductor layer 105 may form a channel of a thin film transistor. The semiconductor layer 105 may be disposed in each pixel P in the display area DA, and may also be disposed in the non-display area NDA in some cases. The semiconductor layer 105 may include a source/drain region and an active region. The semiconductor layer 105 may include polycrystalline silicon.

A first insulating layer 111 may be disposed on the semiconductor layer 105. The first insulating layer 111 may be disposed over the entire surface of the base substrate 101. The first insulating layer 111 may be a gate insulating layer having a gate insulating function.

A first conductive layer 120 may be disposed on the first insulating layer 111. In an embodiment, the first conductive layer 120 may include a gate electrode 121 and a first electrode 122 of a storage capacitor. The gate electrode 121 may be electrically connected to the above-described scan line SL.

A second insulating layer 112 may be disposed on the first conductive layer 120. The second insulating layer 112 may insulate the first conductive layer 120 from a second conductive layer 130. The second insulating layer 112 may be selected from the above-mentioned materials of the first insulating layer 111.

The second conductive layer 130 may be disposed on the second insulating layer 112. The second conductive layer 130 may include a second electrode 131 of the storage capacitor. The material of the second conductive layer 130 may be selected from the above-mentioned materials of the first conductive layer 120. The first electrode 122 of the storage capacitor and the second electrode 131 of the storage capacitor may form a capacitor through the second insulating layer 112.

A third insulating layer 113 may be disposed on the second conductive layer 130. The third insulating layer 113 may contain the above-described materials of the first insulating layer 111.

A third conductive layer 140 may be disposed on the third insulating layer 113. The third conductive layer 140 may include a source electrode 141, a drain electrode 142, a source voltage electrode 143, and display pads DP. The source electrode 141 may be electrically connected to the above-described data line DL.

Although not shown, the above-described second insulating layer 112 and the third insulating layer 113 may be disposed between the display pad DP and each link line. Each display pad DP and each link line may be electrically contacted through at least one contact hole through the second insulating layer 112 and the third insulating layer 113. Although not shown, each link line may be electrically connected to a thin film transistor of each pixel P in the display area DA.

The end portion of the display pad DP may be aligned with a side surface of the base substrate 101 and a side surface of the second substrate 200. The display pad DP may not protrude from the side surface of the base substrate 101. The side surface of the display pad DP may electrically contact a surface of the display connection pad DCP.

The display pad DP may be included in the third conductive layer 140. The display pad DP may be formed on the same layer as the source electrode 141, the drain electrode 142, and the source voltage electrode 143. However, the disclosure is not limited thereto, and the display pad DP may be included in a fourth conductive layer 160 to be described later.

The display pad DP may contain a metal material. The display pad DP may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The display pad DP may be a single layer or a multilayer stack of the above-mentioned materials.

A first via layer 151 may be disposed in the third conductive layer 140. The other side surface of the first via layer 151 in the second direction DR2 may be partially covered by the display pad DP. The first via layer 151 may contain an organic insulating material.

A fourth conductive layer 160 may be disposed on the first via layer 151. The fourth conductive layer 160 may include the power supply line PSL and a connection electrode 162. The power supply line PSL may include a first power supply line 161 and a second power supply line 163. The first power supply line 161 may be electrically connected to the source electrode 141 through a contact hole penetrating the first via layer 151. The connection electrode 162 may be electrically connected to the drain electrode 142 through the contact hole penetrating the first via layer 151. The second power supply line 163 may be electrically connected to the source voltage electrode 143 through the contact hole penetrating the first via layer 151.

As described above, the display pad DP may be included in the fourth conductive layer 160. The display pad DP may be formed on the same layer as the first and second power supply lines 161 and 163 and the connection electrode 162.

The second via layer 152 may be disposed on the fourth conductive layer 160. The second via layer 152 may contain the same material as that of the first via layer 151.

An anode electrode ANO may be disposed on the second via layer 152. The anode electrode ANO may be electrically connected to the connecting electrode 162 through a contact hole penetrating the second via layer 152.

The pixel defining layer PDL may be disposed on the anode electrode ANO. The pixel defining layer PDL may include an opening exposing the anode electrode ANO. The pixel defining layer PDL may be formed of an organic insulating material or an inorganic insulating material.

The organic light emitting layer EL may be disposed on the top surface of the anode electrode ANO and in the opening of the pixel defining layer PDL. A cathode electrode CAT may be disposed on the organic light emitting layer EL and the pixel defining layer PDL. The cathode electrode CAT may be a common electrode disposed over the pixels P.

A capping layer 170 may be disposed on the cathode electrode CAT. The capping layer 170 may cover the cathode electrode CAT. The capping layer 170 may be a multilayer in which an inorganic layer and an organic layer are alternately laminated, but the disclosure is not limited thereto.

The end portion of the cathode electrode CAT may be terminated at a distance from the side surface of the display panel 10. The end portion of the cathode electrode CAT may be covered by the capping layer 170. Therefore, the cathode electrode CAT and the display pad DP may be insulated (electrically disconnected).

The second substrate 200 may be disposed on the capping layer 170. The second substrate 200 may be a transparent substrate. The second substrate 200 may include a glass substrate. The second substrate 200 may be spaced apart from the capping layer 170 by a gap GP (refer to FIG. 4).

The sealant SLT may bond the first substrate 100 to the second substrate 200. The sealant SLT may be disposed along the edges of the second substrate 200. The other side surface of the sealant SLT in the second direction DR2 may be aligned with the base substrate 101 and the second substrate 200. The other end portion of the sealant SLT in the second direction DR2 may extend to a side surface of the display connection pad DCP in the second direction DR2.

The sealant SLT may form the gap GP between the first substrate 100 and the second substrate 200. The gap GP may be filled with air or an inert gas. The second substrate 200 and sealant SLT may prevent permeation of moisture into the first substrate 100. The sealant SLT may include a mineral adhesive member such as a fit. However, the disclosure is not limited thereto, and the sealant SLT may include an organic adhesive member.

Figure 7:
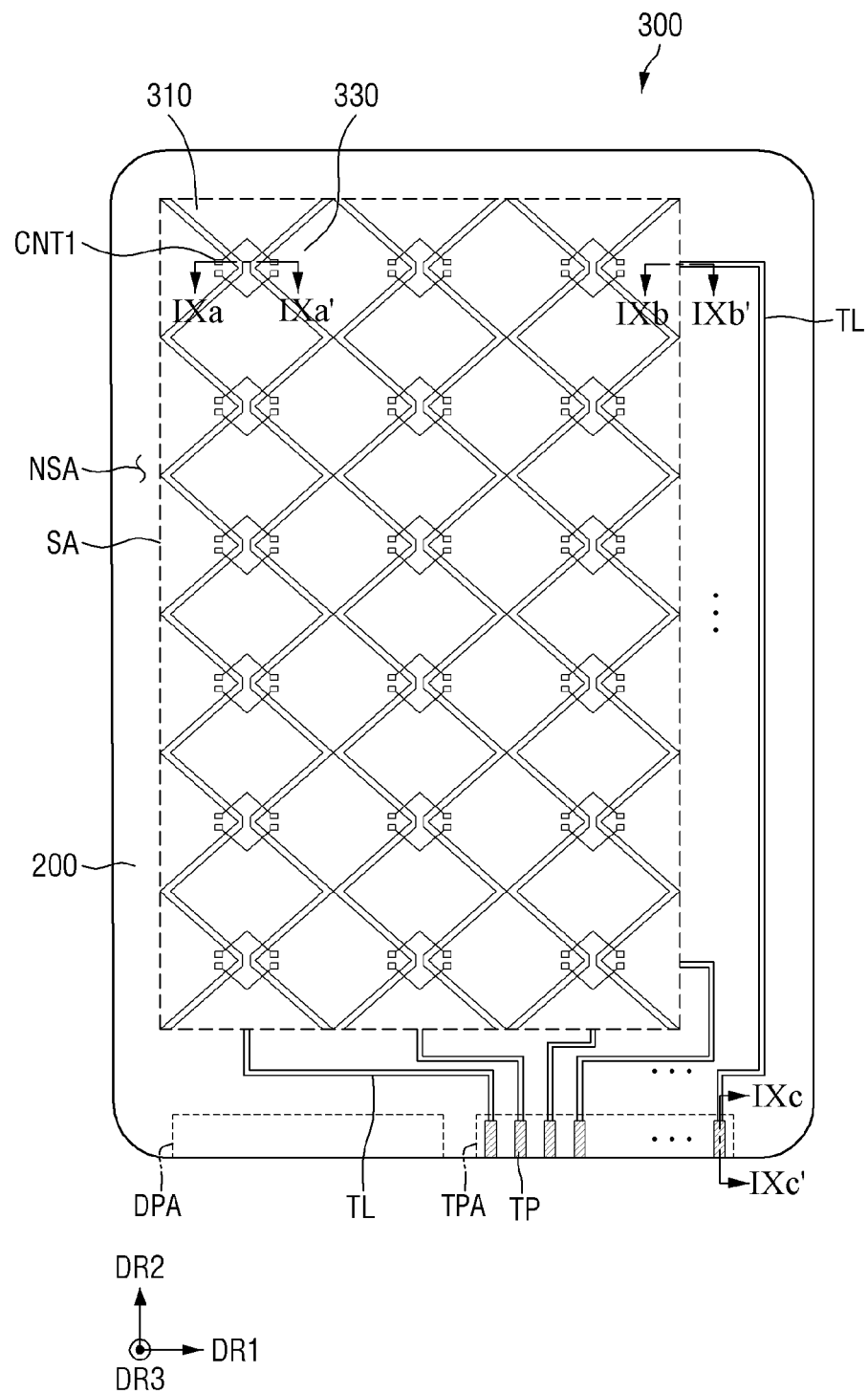
FIG. 7 is a schematic plan view of a touch member according to an embodiment.
Figure 8:
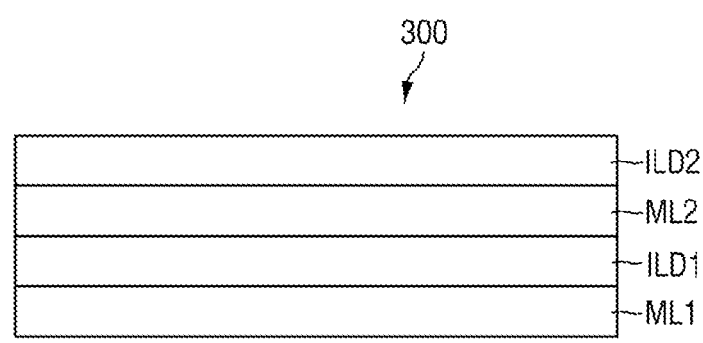
FIG. 8 is a schematic cross-sectional view of a touch member according to an embodiment.
Figure 9:
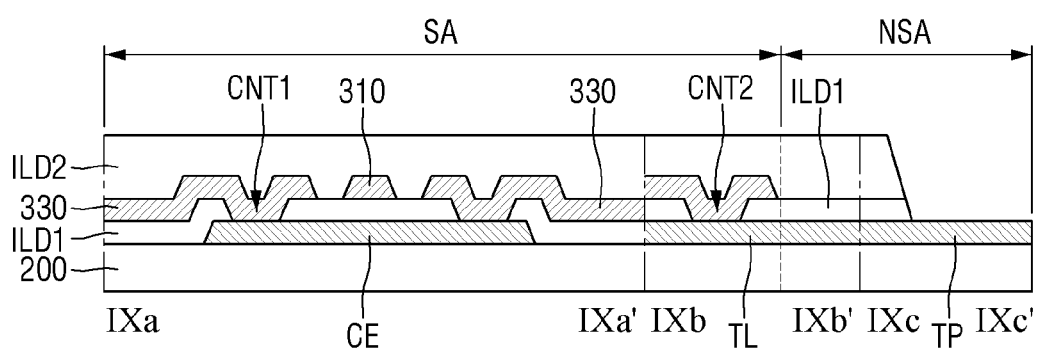
FIG. 9 is a schematic cross-sectional view taken along lines IXa-IXa', IXb-IXb', and IXc-IXc' of FIG. 7.

FIG. 7 is a schematic plan view of a touch member according to an embodiment. FIG. 8 is a schematic cross-sectional view of a touch member according to an embodiment. FIG. 9 is a schematic cross-sectional view taken along lines IXa-IXa', IXb-IXb', and IXc-IXc' of FIG. 7.

Referring to FIGS. 7 to 9, a sensing area SA and a non-sensing area NSA may be defined in the touch member 300. The sensing area SA is an area of the touch member 300 where a touch input is detected. Although the non-sensing area NSA is not an area where a touch input is directly detected, the non-sensing area NSA may prevent coupling of touch signal lines TL1 and TL2 electrically connected to electrode portions for detecting a touch input and prevent the touch signal lines TL1 and TL2 from becoming disconnected due to static electricity. For example, although not shown, a touch ground line (not shown) adjacent to the touch signal lines TL1 and TL2, a touch antistatic line (not shown) adjacent to each of the touch signal lines TL1 and TL2, and the like may be disposed in the non-sensing area NSA, such that the non-sensing area NSA may assist the detection of the touch input in the sensing area SA.

The sensing area SA may overlap the display area DA of the display panel 10 shown in FIG. 5. The non-sensing area NSA may overlap the non-display area NDA of the display panel 10 shown in FIG. 5. In some embodiments, the sensing area SA may be substantially the same as the display area DA of the display panel 10, and the non-sensing area NSA may be substantially the same as the non-display area NDA of the display panel 10.

The non-sensing area NSA may include the touch pad area TPA where touch pads TP are disposed. The touch pad area TPA may be disposed at the lower end (the other end in the second direction DR2 in the drawing) of the touch member 300 in a plan view. In the touch pad area TPA, the touch pads TP may be disposed in parallel in the first direction DR1. The outer surface (the other side surface in the second direction DR2 in the drawing) and a part of the top surface (a side surface in the third direction DR3 in the drawing) of the touch pad TP may be exposed to the outside. The touch pads TP may be disposed on a surface that is perpendicular to the side surface of the display panel 10 where the first circuit board 400 and second circuit board 500 are side-bonded.

The outer surface and the part of the top surface of the touch pad TP exposed to the outside may be partially covered by the touch connection pad TCP. The arrangement of the touch pad TP and the touch connection pad TCP will be described in detail later.

The touch member 300 may include electrode portions 310 and 330 disposed in the sensing area SA to detect a user's touch, and the touch connection pads TCP disposed in a touch pad area TPA around the sensing area SA. The touch connection pads TCP may be formed on the touch member 300 at an edge of the touch member 300 and electrically connected to the second circuit board 500.

Referring to FIGS. 8 and 9, The touch member 300 may include a first conductive layer ML1 disposed on the second substrate 200, a first insulating layer ILD1 disposed on the first conductive layer ML1, a second conductive layer ML2 disposed on the first insulating layer ILD1, and a second insulating layer ILD2 disposed on the second conductive layer ML2.

The first conductive layer ML1 may include a connection electrode CE disposed in the sensing area SA, the touch pad TP disposed in the non-sensing area NSA and electrically connected to the touch connection pad TCP, and a wiring TL that electrically connects the connection electrode CE to the touch pad TP. The first conductive layer ML1 may contain a conductive material having a resistance smaller than that of the second conductive layer ML2 to be described later. The touch pads TP and other components of the first conductive layer ML1 may be disposed on a display surface of the second substrate 200. The display surface of the second substrate 200 may be a plane parallel to the display area DA where the image is displayed. The display surface is perpendicular to side surface of the of the display panel 10 where the first circuit board 400 and second circuit board 500 are side-bonded.

The connection electrode CE may electrically connect the adjacent second electrode portions 330 to be described later through a first contact hole CNT1.

The touch pad TP may extend from the wiring TL. The top surface and the outer surface of the touch pad TP may be exposed to the outside. The touch connection pads TCP (see FIG. 10) may be attached to the top surface and the outer surface of the touch pad TP exposed to the outside. The arrangement of the touch pad TP and the touch connection pad TCP will be described in detail later. The touch pad TP may contain an opaque metal. For example, the touch pad TP may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The first insulating layer ILD1 may be disposed on the first conductive layer ML1. The first insulating layer ILD1 may be disposed across the sensing area SA and the non-sensing area NSA. In some embodiments, the first insulating layer ILD1 may contain an insulating material. In some embodiments, the insulating material may be an inorganic insulating material or an organic insulating material.

The first insulating layer ILD1 may include the first contact hole CNT1 and a second contact hole CNT2. The adjacent second electrode portions 330 may be electrically connected through the first contact hole CNT1. The wiring TL may be electrically connected to the first electrode portion 310 and the second electrode portion 330 to be described later through the second contact hole CNT2.

The second conductive layer ML2 may include a first electrode portion 310 and a second electrode portion 330. The first electrode portion 310 and the second electrode portion 330 may be disposed in the sensing area SA. One of the first electrode portion 310 and the second electrode portion 330 may be a driving electrode, and the other electrode portion may be a sensing electrode. In the embodiment, a case where the first electrode portion 310 may be the driving electrode and the second electrode portion 330 may be the sensing electrode will be described as an example. In case that the first electrode portion 310 is the driving electrode and the second electrode portion 330 is the sensing electrode, the wiring TL electrically connected to the first electrode portion 310 may be a touch driving line, and the wiring TL electrically connected to the second electrode portion 330 may be a touch sensing line. As described above, the adjacent second electrode portions 330 may be electrically connected to the connection electrode CE through the first contact hole CNT1.

The second conductive layer ML2 may include a conductive material having light transmittance. The sensing area SA overlaps the display area DA of the display panel 10 as described above. The first electrode portion 310 and the second electrode portion 330 disposed in the sensing area SA may contain a conductive material having light transmittance and transmit light emitted from the display panel 10. For example, the second conductive layer ML2 may contain indium tin oxide (ITO) having an amorphous structure. The resistance of indium tin oxide having an amorphous structure with an irregular interatomic structure may be greater than the resistance of the material of the above-described first conductive layer ML1.

If the resistance of the conductive layer constituting the touch member 300 is high, the self-power consumption for driving the touch member 300 may be increased. Furthermore, when the above-described materials of the second conductive layer ML2 are used for the electrode portion for sensing a touch input, resistive-capacitive (RC) delay may occur due to a high resistance. Therefore, to allow the conductive layer constituting the electrode portion of the touch member 300 to have a low resistance while ensuring light transmittance, the first conductive layer ML1 having a relatively low resistance may be electrically connected to the second conductive layer ML2.

A second insulating layer ILD2 may be disposed on the second conductive layer ML2. The second insulating layer ILD2 may be disposed across the sensing area SA and the non-sensing area NSA. In some embodiments, the second insulating layer ILD2 may include an insulating material. In some embodiments, the insulating material may be an inorganic insulating material or an organic insulating material.

Figure 10:
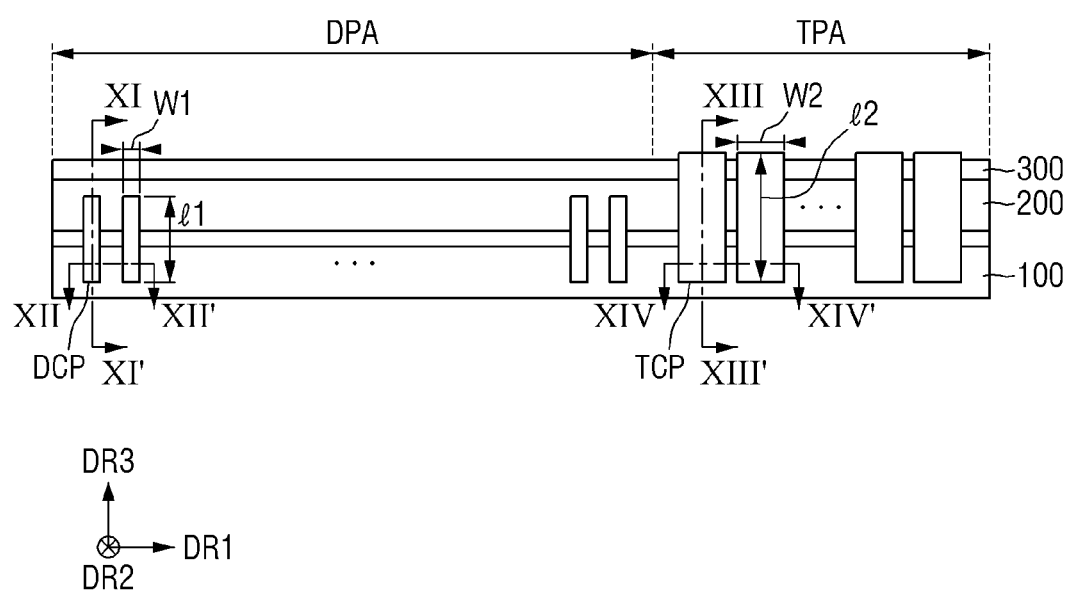
FIG. 10 is a schematic diagram illustrating a side surface of a display device according to an embodiment.
Figure 11:
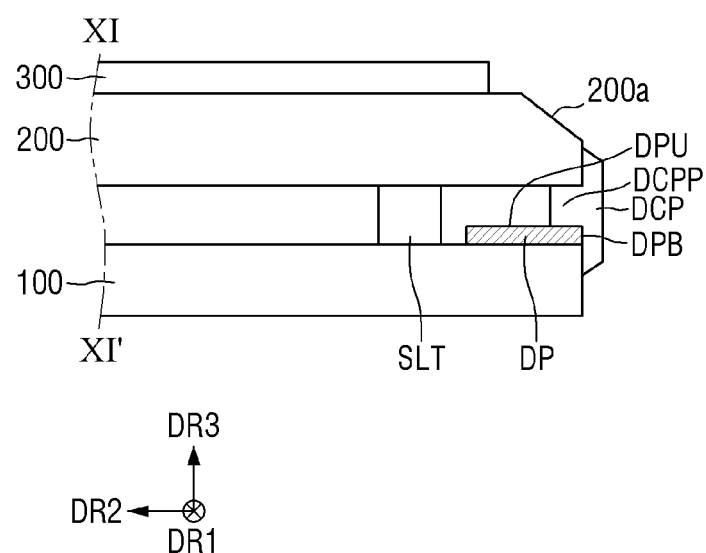
FIG. 11 is a schematic cross-sectional view taken along line XI-XI' of FIG. 10.
Figure 12:
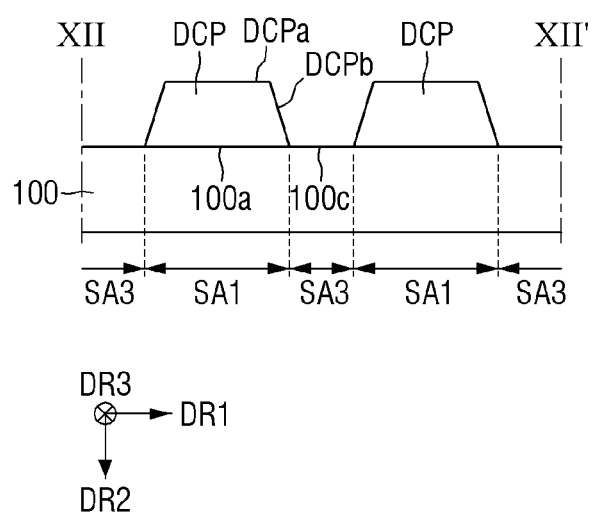
FIG. 12 is a schematic cross-sectional view taken along line XII-XII' of FIG. 10.
Figure 13:
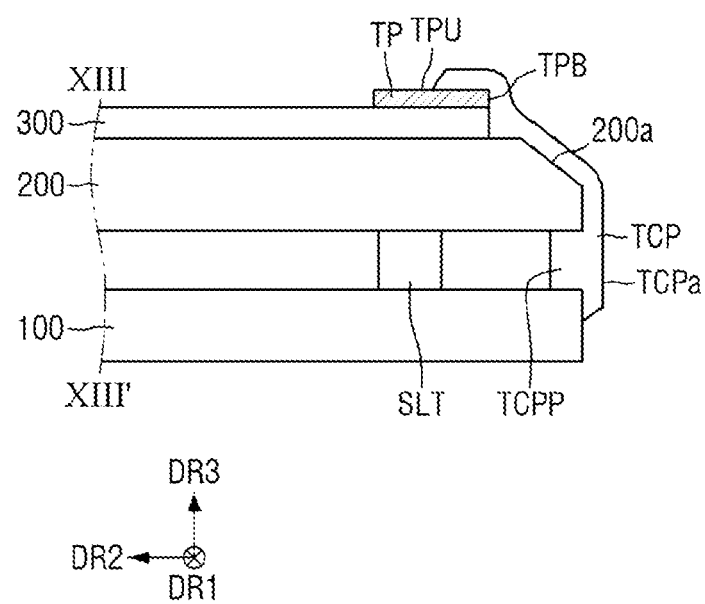
FIG. 13 is a schematic cross-sectional view taken along line XIII-XIII' of FIG. 10.
Figure 14:
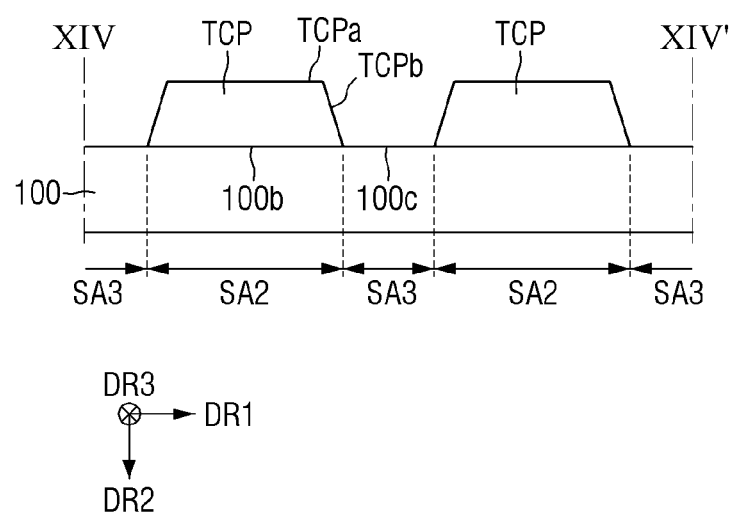
FIG. 14 is a schematic cross-sectional view taken along line XIV-XIV' of FIG. 10.

FIG. 10 is a schematic diagram illustrating a side surface of a display device according to an embodiment. FIG. 11 is a schematic cross-sectional view taken along line XI-XI' of FIG. 10. FIG. 12 is a schematic cross-sectional view taken along line XII-XII' of FIG. 10. FIG. 13 is a schematic cross-sectional view taken along line XIII-XIII' of FIG. 10. FIG. 14 is a schematic cross-sectional view taken along line XIV-XIV' of FIG. 10. The side surface of the display device 1 shown in FIG. 10 is a side surface where the display connection pads DCP and the touch connection pads TCP are disposed.

The arrangement relationship between the display pad DP, the display connection pad DCP, the touch pad TP, and the touch connection pad TCP will be described in detail with reference to FIGS. 10 to 14.

Referring to FIGS. 10 to 15, a side surface of the display device 1 may include the display pad area DPA where the display connection pads DCP are disposed, and the touch pad area TPA where the touch connection pads TCP are disposed.

The display connection pads DCP may be disposed along the first direction DR1 on the other side surface of the display panel 10 in the second direction DR2. Each of the display connection pads DCP may have a shape extending in the third direction DR3. Each of the display connection pads DCP may have a first width W1 in the first direction DR1 and a first length l1 in the third direction DR3. The first length l1 may be smaller than the thickness of the display panel 10 in the third direction DR3.

Each of the display connection pads DCP may electrically contact the display pad DP. Each of the display connection pads DCP may include a first protrusion DCPP protruding toward the sealant SLT between the first substrate 100 and the second substrate 200. The first protrusion DCPP may be disposed between the display pad DP and the second substrate 200. The second substrate 200 may include an upper chamfer portion 200a disposed at an end overlapping the display pad DP as shown in FIG. 11.

Referring to FIG. 11, a top surface DPU of the display pad DP may partially contact the display connection pad DCP. The top surface DPU of the display pad DP may contact the first protrusion DCPP of the display connection pad DCP. An outer surface DPB of the display pad DP may contact the display connection pad DCP.

Referring to FIG. 12, the display connection pad DCP may have a display non-etched surface DCPa and a display etched surface DCPb. The display non-etched surface DCPa may be a surface that is not laser etched because a laser beam is not irradiated thereto in a manufacturing process of the display connection pad DCP, and the display etched surface DCPb may be a surface that is laser etched because the laser beam is irradiated thereto in the manufacturing process of the display connection pad DCP. The other side surface of the display connection pad DCP in the second direction DR2 may be the display non-etched surface DCPa, and a side surface and the other side surface of the display connection pad DCP in the first direction DR1 may be the display etched surface DCPb.

Referring to FIG. 10, the touch connection pads TCP may be disposed along the first direction DR1 at the other end portion of the display device 1 in the second direction DR2. Each of the touch connection pads TCP may have a shape extending in the second direction DR2 or in the third direction DR3. Each of the touch connection pads TCP may have a shape extending in the third direction DR3 on the other side surface of the display panel 10 in the second direction DR2, and may have a shape extending in the second direction DR2 on one side surface of the touch member 300 in the third direction DR3. Each of the touch connection pads TCP may have a second width W2 greater than the first width W1 in the first direction DR1 and a second length l2 greater than the first length l1 in the longitudinal direction. Each of the touch connection pads TCP may partially cover the touch pad TP disposed on the touch member 300.

Referring to FIG. 13, each of the touch connection pads TCP may electrically contact the touch pad TP. Each of the touch connection pads TCP may include a second protrusion TCPP protruding toward the sealant SLT between the first substrate 100 and the second substrate 200. The second protrusion TCPP may be disposed between the first substrate 100 and the second substrate 200.

The other side surface TPB of the touch pad TP in the second direction DR2 may be in electrical contact with the touch connection pad TCP, and a side surface TPU of the touch pad TP in the third direction DR3 may partially contact the touch connection pad TCP. The touch connection pad TCP may cover the other side surface TPB of the touch pad TP in the second direction DR2 and a part of one side surface TPU of the touch pad TP in the third direction DR3.

Referring to FIG. 14, the touch connection pad TCP may include a touch non-etched surface TCPa and a touch etched surface TCPb. The touch non-etched surface TCPa may be a surface that is not laser etched because a laser beam is not irradiated thereto in a manufacturing process of the touch connection pad TCP, and the touch etched surface TCPb may be a surface that is laser etched because the laser beam is irradiated thereto in the manufacturing process of the touch connection pad TCP. The other side surface of the touch connection pad TCP in the second direction DR2 may be the touch non-etched surface TCPa, and a side surface and the other side surface of the touch connection pad TCP in the first direction DR1 may be the touch etched surfaces TCPb.

The other side surface of the first substrate 100 in the second direction DR2 may include a first side surface 100a disposed in a first area SA1 overlapping the display connection pad DCP, a second side surface 100b disposed in a second area SA2 overlapping the touch connection pad TCP, and a third side surface 100c disposed in a third area SA3 that does not overlap the display connection pad DCP and does not overlap the touch connection pad TCP. The connection pads DCP and TCP may not be disposed on the third side surface 100c.

On the other side surface of the display panel 10 in the second direction DR2, the first area SA1, the second area SA2, and the third area SA3 may be disposed on a same plane. The other side surface of the display panel 10 in the second direction DR2 may have a flat shape without steps.

Furthermore, the other side surface of the display panel 10 in the second direction DR2 may have a uniform roughness for each region. The first area SA1, the second area SA2 and the third area SA3 may have the same roughness.

Referring to FIGS. 10 to 14, The display device 1 according to an embodiment may reduce damage to a substrate. Since a conductive material CDL (refer to FIG. 17) is not disposed between the display pads DP disposed along one direction, short circuits between the display pads DP may be prevented. Furthermore, since the conductive material CDL is not disposed between the touch pads TP disposed along one direction, short circuits between the touch pads TP may be prevented.

Figure 15:
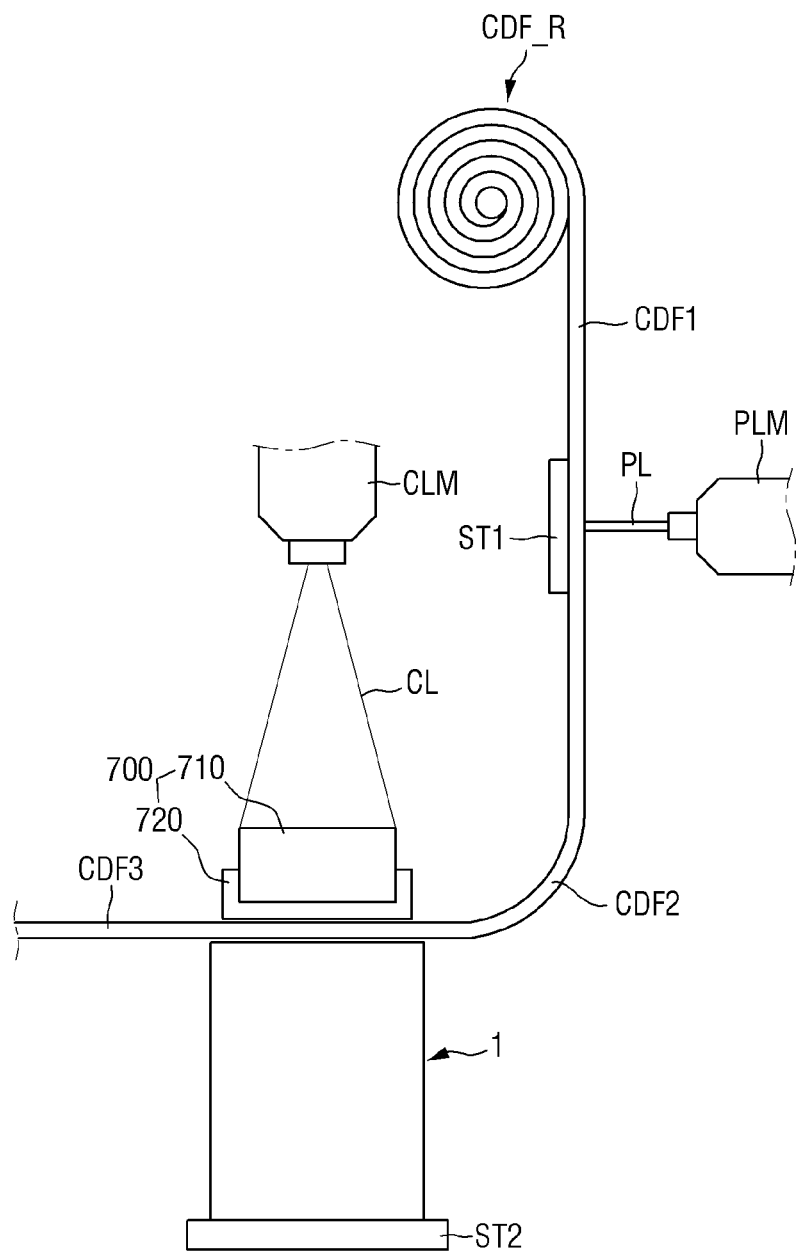
FIG. 15 is a schematic view illustrating an apparatus for manufacturing a display device according to an embodiment.

FIG. 15 is a schematic view illustrating an apparatus for manufacturing a display device according to an embodiment.

Referring to FIG. 15, an apparatus for manufacturing the display device 1 according to an embodiment is an apparatus for patterning a conductive material CDL on a conductive film CDF and transferring the patterned conductive material CDL onto a surface of the display device 1.

The apparatus for manufacturing the display device 1 according to an embodiment may include a first stage ST1, a first laser module PLM for emitting a first laser beam PL toward the first stage ST1, a second stage ST2 disposed at one side of the first stage ST1, a pressing tool 700 disposed above the second stage ST2, and a second laser module CLM for emitting a second laser beam CL toward the second stage ST2 with the pressing tool 700 interposed therebetween.

The conductive film CDF may be formed on the first stage ST1. The first stage ST1 may provide a space where the process of patterning the conductive material CDL is executed. The first stage ST1 may be configured such that an inclination angle is adjustable.

The conductive film CDF may include a reel conductive film CDF_R wound in a reel shape on a side of the first stage ST1. The reel conductive film CDF_R may be unreeled and fed toward the first stage ST1.

The conductive film CDF may include a first film part CDF1 in a state before reaching the first stage ST1 by being released from the reel conductive film CDF_R. The first film part CDF1 may include a base film BF (refer to FIG. 17) and the conductive material CDL (refer to FIG. 17) disposed on the base film BF. The conductive material CDL may contain, for example, an epoxy binder material and silver (Ag) particles. However, the conductive material CDL is not limited thereto, and may contain an electrically conductive material.

Figure 17:
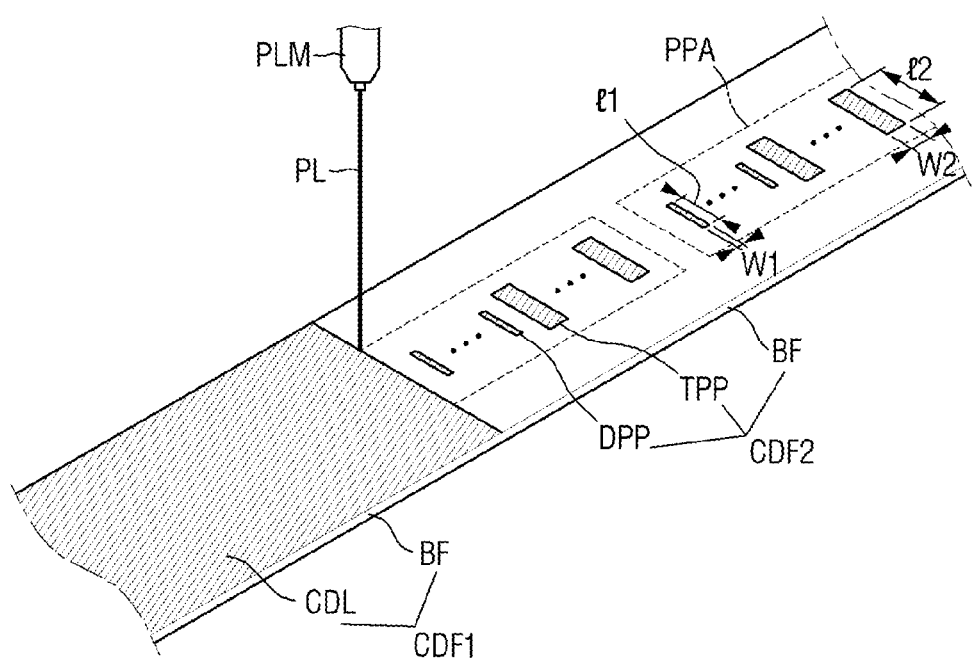
FIGS. 17 to 20 are schematic diagrams illustrating a method for manufacturing a display device according to an embodiment.

The first laser module PLM may be disposed above the first stage ST1 as shown in FIG. 17. The first laser module PLM may emit the first laser beam PL toward the first stage ST1. The first laser beam PL may be a short pulse laser beam. The first laser module PLM may pattern the conductive material CDL into a desired shape using the first laser beam PL.

The second stage ST2 may be disposed at a side of the first stage ST1. The second stage ST2 may provide a space where the process of transferring the display connection pad DCP and the touch connection pad TCP onto a side surface of the display device 1 is performed. Furthermore, the second stage ST2 may provide a space where the process of bonding the first circuit board 400 and the second circuit board 500 onto the display connection pad DCP and the touch connection pad TCP of the display device 1, respectively, is performed. The second stage ST2 may be configured such that the inclination angle is adjustable.

The process of transferring the display connection pad DCP and the touch connection pad TCP onto one side surface of the display device 1, and the process of bonding the first circuit board 400 and the second circuit board 500 onto the display connection pad DCP and the touch connection pad TCP of the display device 1, respectively, will be described later with reference to FIGS. 16 to 20.

The second laser module CLM may be disposed above the second stage ST2. The second laser module CLM may emit the second laser beam CL toward the second stage ST2. The second laser beam CL may be a continuous wave (CW) laser beam. The second laser module CLM may transfer the display connection pad DCP and the touch connection pad TCP onto a side surface of the display device 1 using the second laser beam CL. The second laser module CLM may bond the first circuit board 400 and the second circuit board 500 onto the display connection pad DCP and the touch connection pad TCP, respectively, using the second laser beam CL.

The pressing tool 700 may be disposed between the second stage ST2 and the second laser module CLM. The pressing tool 700 may assist the transfer process and the bonding process by pressing or heating a side surface of the display device 1. Furthermore, the pressing tool 700 may transmit the second laser beam CL used for transferring the display connection pad DCP and the touch connection pad TCP and bonding the first circuit board 400 and the second circuit board 500 onto the display connection pad DCP and the touch connection pad TCP, respectively.

The pressing tool 700 may include a first pressing tool 710 and a second pressing tool 720 disposed below the first pressing tool 710.

The first pressing tool 710 may contain a transparent material such as quartz, glass, or the like, and may transmit the second laser beam CL. The bottom surface of the first pressing tool 710 may have an inclined surface. Since the bottom surface of the pressing tool 700 has an inclined surface, the pressing tool 700 may easily press an object having a bent surface.

The second pressing tool 720 may be disposed to cover the first pressing tool 710. The second pressing tool 720, which is a component of the pressing tool 700 that is in contact with the display device 1 in the transfer process and the bonding process, may contain an elastic material. For example, the second pressing tool 720 may contain silicon. The damage to the display device 1 in the transfer process and the bonding process may be minimized by the second pressing tool 720.

The conductive film CDF includes a second film part CDF2 including a patterned conductive material in a state before reaching the second stage ST2 after passing through the first stage ST1, and a third film part CDF3 including a patterned conductive material in a state after passing through the second stage ST2. The second film part CDF2 may include a base film BF and a patterned conductive material (refer to "DPP" and "TPP" in FIG. 17) disposed on the base film BF. The third film part CDF3 may be substantially the same as the base film BF since the patterned conductive materials DPP and TPP have been transferred to the display device 1.

Figure 16:
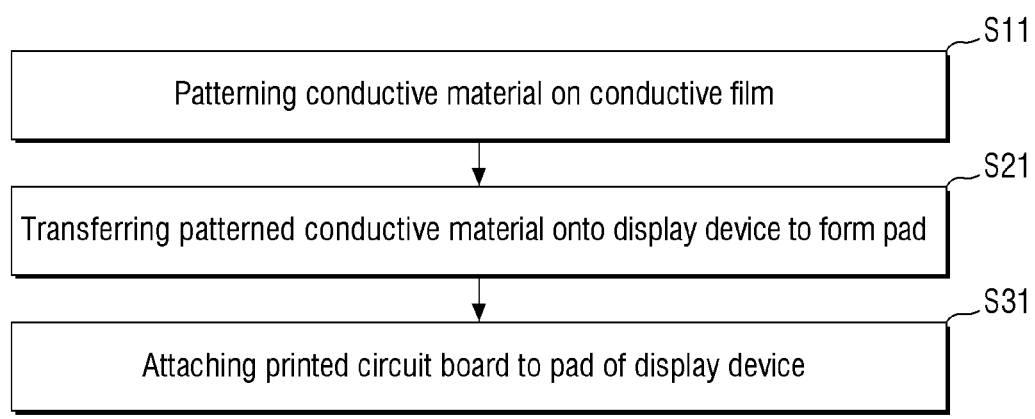
FIG. 16 is a flowchart showing a method for manufacturing a display device according to an embodiment.

FIG. 16 is a flowchart showing a method for manufacturing a display device according to an embodiment. FIGS. 17 to 20 are schematic diagrams illustrating a method for manufacturing a display device according to an embodiment.

Referring to FIG. 16, a method for manufacturing the display device 1 according to an embodiment may include a step S11 of patterning the conductive material CDL on the conductive film CDF, a step S21 of transferring the patterned conductive material onto the display device 1 to form a pad, and a step S31 of attaching the printed circuit board on the pad of the display device 1.

Referring to FIG. 17, the step of patterning the conductive material CDL on the conductive film CDF may be performed using the first laser module PLM described with reference to FIG. 15. The first laser module PLM may emit the first laser beam PL that is a short pulse laser beam. In an embodiment, the first laser module PLM may emit the first laser beam PL in a state where the first laser module PLM is fixed and the conductive film CDF moves. In another example, the first laser module PLM may emit the first laser beam PL while moving together with the conductive film CDF, but the disclosure is not limited thereto. The patterning of the conductive material CDL on the conductive film CDF may be performed at the same time as the feeding of the conductive film CDF.

When the conductive material CDL on the conductive film CDF is patterned, pad pattern areas PPA may be formed on the base film BF. The pad pattern areas PPA may be disposed along the longitudinal direction of the conductive film CDF. Each of the pad pattern areas PPA may include display pad patterns DPP and touch pad patterns TPP.

The display pad patterns DPP may be disposed in the longitudinal direction of the conductive film CDF. Each of the display pad patterns DPP may become the display connection pad DCP in the display device 1 by the transfer process to be described later. Each of the display pad patterns DPP may have a shape extending in the width direction of the conductive film CDF. Each of the display pad patterns DPP may have a first width W1 in the longitudinal direction of the conductive film CDF and a first length l1 in the width direction of the conductive film CDF.

The touch pad patterns TPP may be disposed in the longitudinal direction of the conductive film CDF. The touch pad patterns TPP may be disposed at one side of the display pad patterns DPP in the longitudinal direction of the conductive film CDF. Each of the touch pad patterns TPP may become the touch connection pad TCP of the display device 1 by the transfer process to be described later. Each of the touch pad patterns TPP may have a shape extending in the width direction of the conductive film CDF. Each of the touch pad patterns TPP may have a second width W2 greater than the first width W1 in the longitudinal direction of the conductive film CDF, and may have a second length l2 greater than the first length l1 in the width direction of the conductive film CDF.

Figure 18:
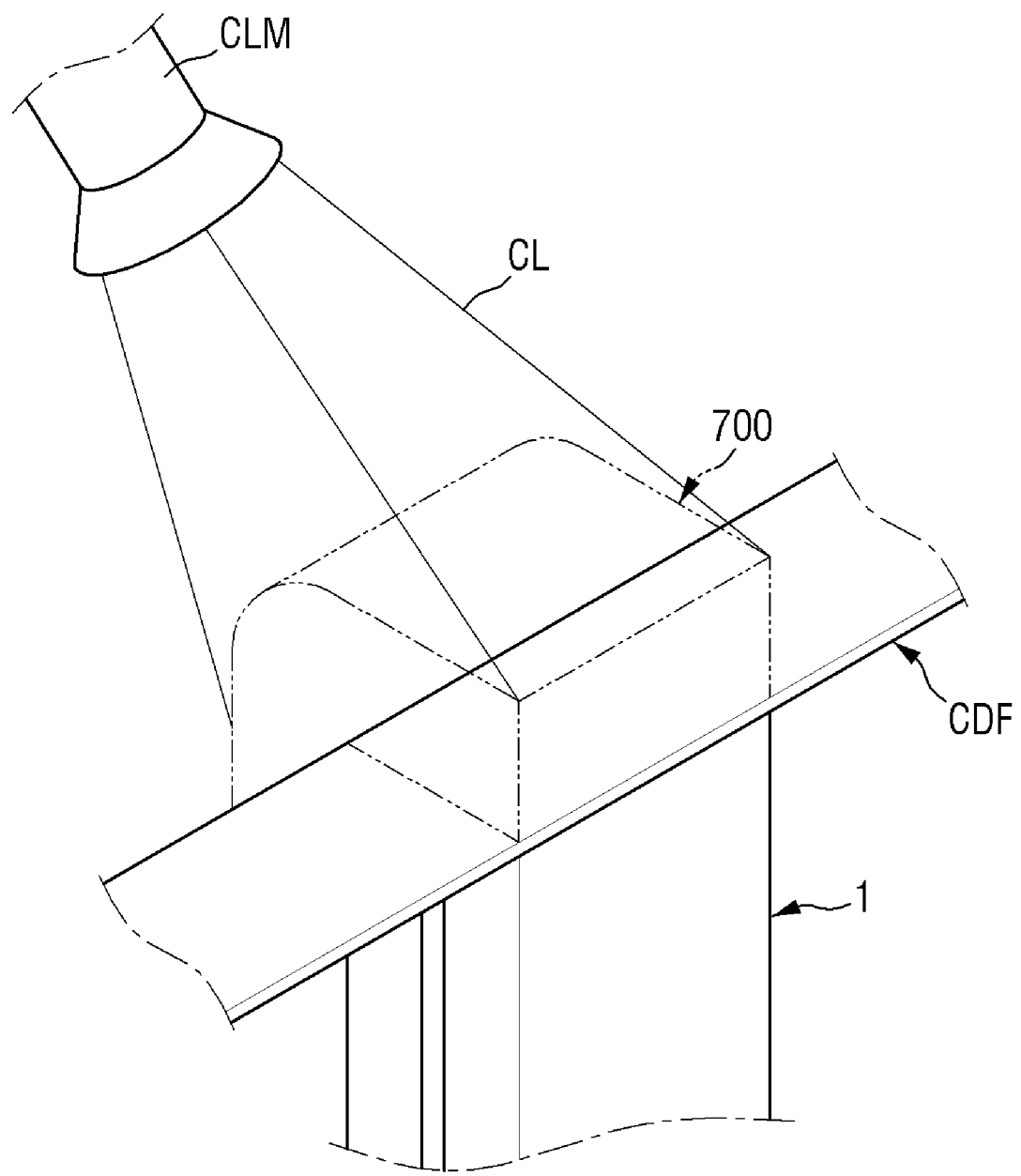
Figure 19:
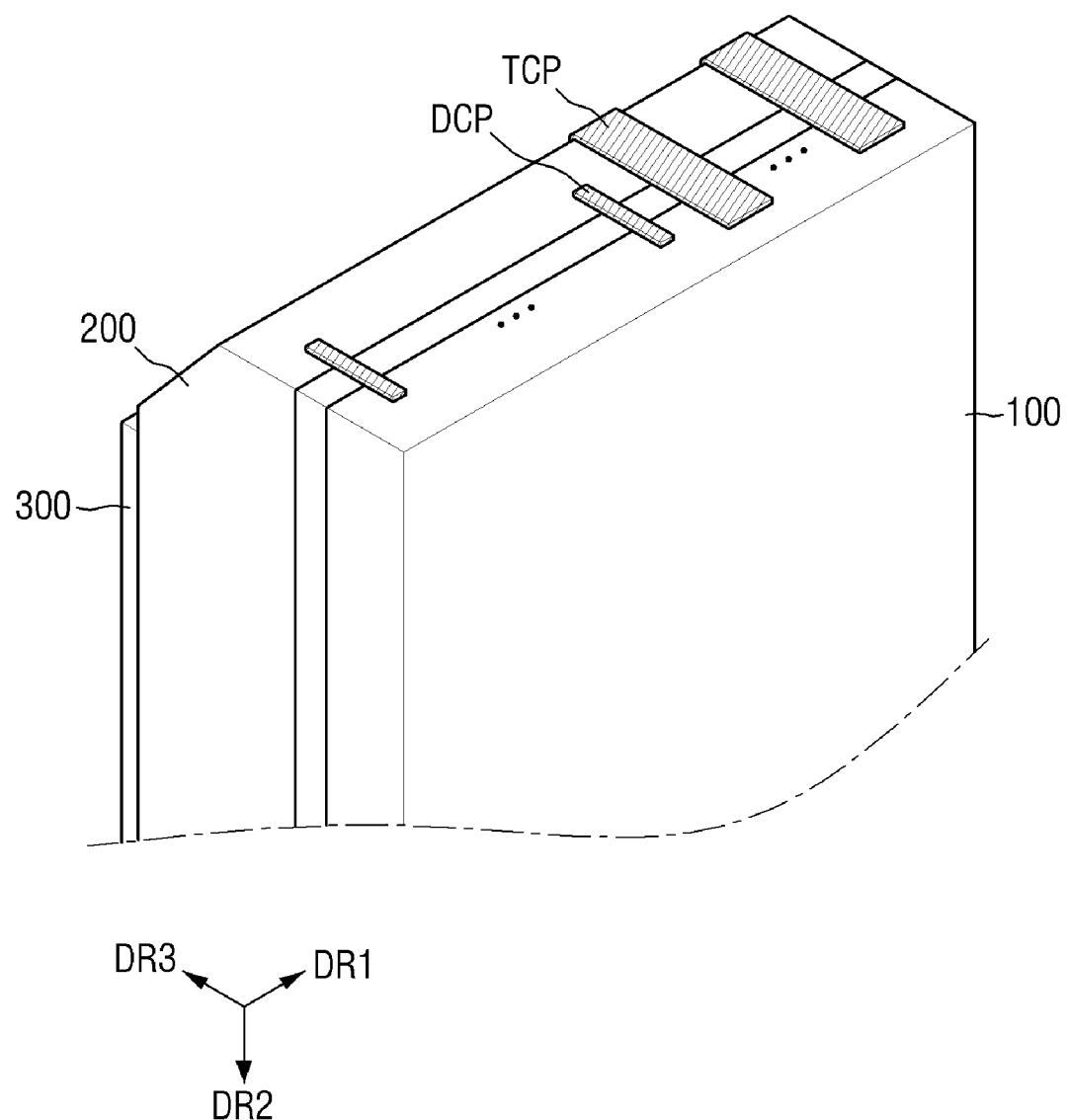

Referring to FIGS. 18 and 19, after the step S11 of patterning the conductive material CDL on the conductive film CDF, the step S21 of transferring the patterned conductive material CDL onto the display device 1 to form a pad may be executed. The patterned conductive material CDL may form the display pad pattern DPP and the touch pad pattern TPP.

The second laser beam CL may be irradiated in a state where the patterned conductive film CDF is disposed on a side surface of the display device 1 and the conductive film CDF is pressed by the pressing tool 700. The second laser beam CL may be emitted from the second laser module CLM and may be a continuous wave (CW) laser beam. At this time, the surface of the conductive film CDF on which the display pad pattern DPP and the touch pad pattern TPP are formed may be disposed toward the display device 1. The display pad pattern DPP and the touch pad pattern TPP may be transferred onto a side surface of the display device 1. Due to this process, the display pad pattern DPP on the conductive film CDF may become the display connection pad DCP, and the touch pad pattern TPP on the conductive film CDF may become the touch connection pad TCP.

In case that the display pad pattern DPP of the conductive film CDF is transferred to the display device 1, the display pad pattern DPP may become the display connection pad DCP. In case that the touch pad pattern TPP of the conductive film CDF is transferred to the display device 1, the touch pad pattern TPP may become the touch connection pad TCP.

The pressing tool 700 may cover the entire area where the display connection pad DCP and the touch connection pad TCP are formed. For example, the pressing tool 700 may cover a part of the top surface of the touch member 300. Furthermore, the second laser beam CL may be emitted and irradiated to the entire area where the display pad pattern DPP and the touch pad pattern TPP are transferred.

As described above, the pressing tool 700 may assist the transfer process by pressing or heating a side of the display device 1 on which the display connection pad DCP and the touch connection pad TCP are formed. The pressing tool 700 may transmit the second laser beam CL used when transferring the display connection pad DCP and the touch connection pad TCP.

Figure 20:
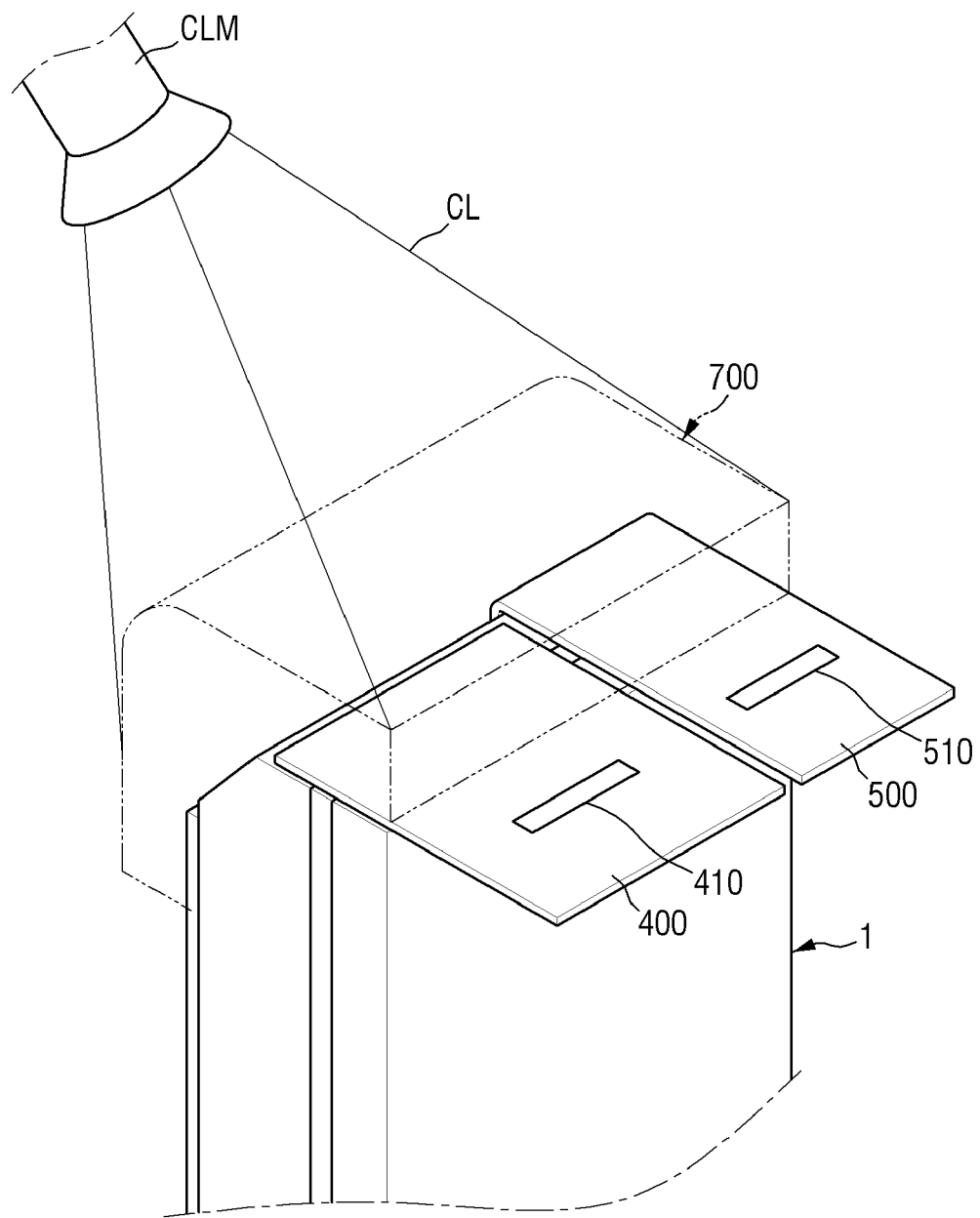

Referring to FIG. 20, after the step S21 of transferring the patterned conductive material CDL to the display device 1 to form a pad, the step S31 of attaching the printed circuit board onto the pad of the display device 1 may be executed. When the display connection pad DCP and the touch connection pad TCP are formed on the display device 1, the first circuit board 400 having the display driving circuit 410 may be disposed on the display connection pad DCP and the second circuit board 500 having the touch driving circuit 510 may be disposed on the touch connection pad TCP.

Pressing the first circuit board 400 and the second circuit board 500 onto a side surface of the display device 1 and laser bonding the first circuit board 400 and the second circuit board 500 may be performed substantially simultaneously.

The step of laser bonding the first circuit board 400 and the second circuit board 500 may be performed by transmitting the laser beam through the pressing tool 700. In case that the first circuit board 400 and the second circuit board 500 are disposed on one side surface of the display device 1, the second laser beam CL may be irradiated in a state where the first circuit board 400 and the second circuit board 500 are pressed by the pressing tool 700. As described in the transfer process, the second laser beam CL may be emitted from the second laser module CLM and may be a continuous wave (CW) laser beam.

An anisotropic conductive film CDF may be disposed between the display connection pad DCP and the first circuit board 400 and between the touch connection pad TCP and the second circuit board 500. The display connection pad DCP and the first circuit board 400 may be electrically connected through the anisotropic conductive film CDF, and the touch connection pad TCP and the second circuit board 500 may be electrically connected through the anisotropic conductive film CDF.

Due to the step of laser bonding the first circuit board 400 and the second circuit board 500, the anisotropic conductive film CDF disposed between the first and second circuit boards 400 and 500 and the connection pads is cured, so that the first circuit board 400 and the second circuit board 500 may be attached onto the display connection pad DCP and the touch connection pad TCP, respectively.

In accordance with the method for manufacturing the display device 1 according to an embodiment, the display pad pattern DPP and the touch pad pattern TPP may be formed by patterning the conductive material CDL on a separate conductive film CDF, and then transferred onto one side surface of the display device 1 to form the display connection pad DCP and the touch connection pad TCP. Accordingly, the display device 1 having a side surface to which the first circuit board 400 and the second circuit board 500 are attached may be manufactured by a simple process. In accordance with the method for manufacturing the display device 1 according to an embodiment, damage to the display device 1 may be minimized.

Hereinafter, an embodiment of the display device 1 having a side surface to which the first circuit board 400 and the second circuit board 500 are attached will be described. In the following embodiments, a description of the same components as those of the above-described embodiment will be omitted or simplified, and differences will be described.

Figure 21:
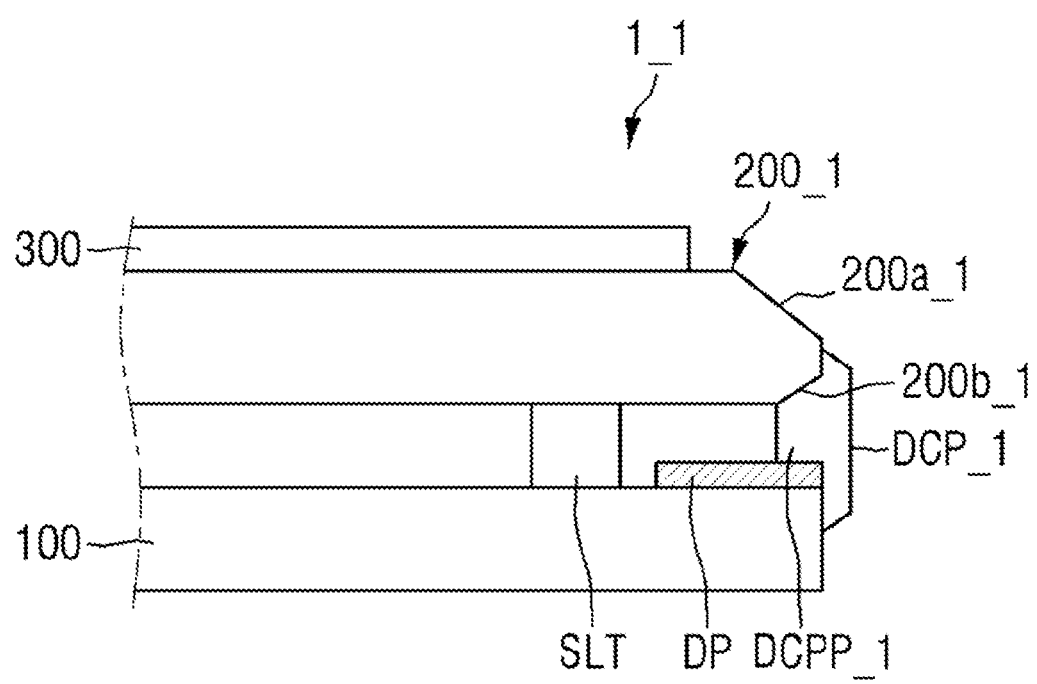
FIG. 21 is a schematic cross-sectional view illustrating a display device according to an embodiment.

FIG. 21 is a cross-sectional view illustrating a display device according to an embodiment.

Referring to FIG. 21, a display device 1_1 according to the embodiment may include a second substrate 200_1 having a shape different from that of the second substrate 200 of the display device 1 according to an embodiment, and a display connection pad DCP_1.

The second substrate 200_1 may further include a lower chamfer portion 200b_1 expect for an upper chamfer portion 200a_1 which corresponds to the upper chamfer portion 200a in FIG. 11. The display connection pad DCP_1 may secure a wider contact area with the display pad DP due to the lower chamfer portion 200b_1. Each of the display connection pads DCP_1 may include a first protrusion DCPP_1 protruding toward the sealant SLT between the first substrate 100 and the second substrate 200_1. The first protrusion DCPP_1 may be disposed between the display pad DP and the second substrate 200_1. The other side surface of the display pad DP in the second direction DR2 may be in contact with the display connection pad DCP_1, and one side surface of the display pad DP in the third direction DR3 may partially contact with the display connection pad DCP_1. The display connection pad DCP_1 may cover the other side surface of the display pad DP in the second direction DR2 and a part of a side surface of the display pad DP in the third direction DR3. Due to the lower chamfer portion 200b_1, the first protrusion DCPP_1 of the embodiment may protrude more toward the sealant SLT than the first protrusion DCPP of FIG. 11. Accordingly, it is possible to secure a wider contact area between the display connection pad DCP_1 and the display pad DP.

The display device 1_1 according to the embodiment may reduce damage to a substrate. Since a conductive material CDL is not disposed between the display pads DP, short circuits between the display pads DP may be prevented. Furthermore, since the conductive material CDL is not disposed between the touch pads TP, short circuits between the touch pads TP may be prevented.

In the display device 1_1 according to the embodiment, it is possible to improve electrical conductivity between the display connection pad DCP_1 and the display pad DP by securing a wider contact area between the display connection pad DCP_1 and the display pad DP. Although not shown, it is also possible to improve electrical conductivity between the touch connection pad TCP and the touch pad TP by securing a wider contact area between the touch connection pad TCP and the touch pad TP.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
a display panel including display pads;
display connection pads disposed on a side surface of the display panel and connected to the display pads;
a touch member including touch pads disposed on a display surface perpendicular to the side surface of the display panel; and
touch connection pads overlapping a top surface of the touch member and the side surface of the display panel, the touch connection pads connected to the touch pads, wherein
the side surface of the display panel includes:
a first area overlapping the display connection pads;
a second area overlapping the touch connection pads; and
a third area which does not overlap the display connection pads and does not overlap the touch connection pads, and
the first area, the second area, and the third area are located on a same plane.

2. The display device of claim 1, wherein the side surface of the display panel has a uniform roughness in the first area, the second area, and the third area.

3. The display device of claim 1, wherein
the side surface includes:
a display pad area where the display pads and the display connection pads are arranged; and
a touch pad area where the touch pads and the touch connection pads are arranged, and
the touch pad area and the display pad area are arranged in a first direction.

4. The display device of claim 3, wherein the display pads and the touch pads are arranged in the first direction.

5. The display device of claim 3, further comprising:
a first circuit board disposed on the display connection pads, and a display driving circuit being disposed on the first circuit board; and
a second circuit board disposed on the touch connection pads, and a touch driving circuit being disposed on the second circuit board.

6. The display device of claim 5, wherein the second circuit board partially overlaps the top surface of the touch member.

7. The display device of claim 1, wherein the display panel includes:
a first substrate;
a second substrate disposed on the first substrate; and
a sealant disposed between the first substrate and the second substrate.

8. The display device of claim 7, wherein each of the display connection pads and the touch connection pads has a shape protruding toward the sealant.

9. The display device of claim 7, wherein the second substrate includes a chamfer portion disposed at an end overlapping the display pad.

* * * * *